United States Patent
Bagheri et al.

(10) Patent No.: US 9,496,684 B2
(45) Date of Patent: Nov. 15, 2016

(54) SYSTEM TO CONTROL AN OPTICAL SIGNAL

(75) Inventors: Harry H. Bagheri, Poughkeepsie, NY (US); Casimer M. DeCusatis, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1908 days.

(21) Appl. No.: 12/645,409

(22) Filed: Dec. 22, 2009

(65) Prior Publication Data

US 2011/0149385 A1    Jun. 23, 2011

(51) Int. Cl.
| | |
|---|---|
| H01S 5/00 | (2006.01) |
| H01S 5/0683 | (2006.01) |
| H04B 10/291 | (2013.01) |
| H04B 10/299 | (2013.01) |
| H04B 10/50 | (2013.01) |
| H01S 5/40 | (2006.01) |

(52) U.S. Cl.
CPC .......... *H01S 5/0683* (2013.01); *H04B 10/299* (2013.01); *H04B 10/2914* (2013.01); *H04B 10/503* (2013.01); *H01S 5/4006* (2013.01); *H01S 2301/04* (2013.01)

(58) Field of Classification Search
CPC ............... H01S 5/4006; H01S 5/0683; H01S 2301/04; H04B 10/2914; H04B 10/503; H04B 10/299

USPC .................... 359/344, 337; 372/20
See application file for complete search history.

(56) References Cited

U.S. PATENT DOCUMENTS

| | | | | |
|---|---|---|---|---|
| 5,019,787 | A * | 5/1991 | Carlson et al. | 398/180 |
| 5,153,933 | A * | 10/1992 | Smith et al. | 385/27 |
| 6,046,841 | A * | 4/2000 | Mahgerefteh et al. | 359/326 |
| 6,538,808 | B1 | 3/2003 | Tastavridis | 359/344 |
| 6,584,126 | B2 * | 6/2003 | Wang et al. | 372/20 |
| 6,611,546 | B1 | 8/2003 | Garnache et al. | 372/92 |
| 6,747,794 | B2 | 6/2004 | Wang | 359/344 |
| 6,775,316 | B2 | 8/2004 | Vakhshoori et al. | 372/109 |
| 6,900,930 | B2 * | 5/2005 | Ovadia et al. | 359/337 |
| 7,058,263 | B2 | 6/2006 | Welch et al. | 385/37 |
| 7,489,440 | B2 * | 2/2009 | Atkins et al. | 359/344 |
| 8,031,398 | B2 * | 10/2011 | Atkins et al. | 359/344 |
| 2002/0176476 | A1 * | 11/2002 | Vakhshoori et al. | 372/101 |
| 2004/0022306 | A1 * | 2/2004 | Baumgartner | 375/220 |
| 2004/0042069 | A1 * | 3/2004 | Fisher | 359/344 |
| 2004/0136414 | A1 * | 7/2004 | Matsumoto et al. | 372/20 |
| 2004/0228384 | A1 * | 11/2004 | Oh et al. | 372/96 |
| 2008/0094693 | A1 * | 4/2008 | Atkins et al. | 359/344 |

* cited by examiner

*Primary Examiner* — Mark Hellner
(74) *Attorney, Agent, or Firm* — Ido Tuchman; Steven Chiu

(57) ABSTRACT

A system to control an optical signal may include a semiconductor laser diode. The system may also include an optical amplifier to receive an optical signal from the semiconductor laser diode. The optical amplifier may be configured to spectrally filter the optical signal.

19 Claims, 4 Drawing Sheets

SYSTEM TO CONTROL AN OPTICAL SIGNAL

BACKGROUND OF THE INVENTION

1. Field of the Invention

The invention relates to the field of optical communications, and, more particularly, to systems to control optical signals in such.

2. Description of Background

There has been significant interest across the data communication industry in the use of Fibre Channel Protocol ("FCP") for networking, storage, and related applications. And, since FCP has become established as an enabler for computer networks, there has been interest in adopting higher bandwidth FCP links.

FCP links may be short wavelength ("SX") links (850 nm center wavelength) or long wavelength ("LX") links (1300 nm center wavelength) as defined by industry standards. An SX link is typically specified in the range of 100 meters or less and an LX link may extend up to 10 kilometers.

In some optical communication links, amplification is required to extend their distances for applications such as disaster recovery in a storage area network. There are many types of amplifiers and semiconductor optical amplifiers ("SOAs") have proved useful for the 850 nm center wavelength and the 1300 nm center wavelength windows, which are most commonly used in data communication systems such as FCP and in other industry standards, e.g. Ethernet.

The SOA, also known as a semiconductor laser amplifier or SLA, is very similar in construction to a semiconductor laser diode, using a mirrored optical cavity to affect gain in the direction of propagation for an optical signal. The mirrors are used to increase the effective path length through the gain medium, and hence increase the overall gain.

In applications which require extremely long distances, probably the most desirable feature of the SOA is high gain. To optimize the achievable distance, SOAs are usually positioned near the middle of a long distance optical link.

SUMMARY OF THE INVENTION

According to one embodiment of the invention, a system to control an optical signal may include a semiconductor laser diode. The system may also include an optical amplifier to receive an optical signal from the semiconductor laser diode. The optical amplifier may be configured to spectrally filter the optical signal.

The semiconductor laser diode may comprise a vertical-cavity surface-emitting laser ("VCSEL") transmitter. The optical amplifier may comprise a semiconductor optical amplifier ("SOA").

The optical amplifier may be adjacent the semiconductor laser diode without any intervening components except for an optical link to carry the optical signal between the optical amplifier and the semiconductor laser diode. The optical amplifier may immediately follow the semiconductor laser diode.

The semiconductor laser diode and the optical amplifier may be carried on a common monolithic integrated circuit. The optical amplifier may be offset from the optical signal's centerpoint to enable the optical signal to couple with the optical link's higher order modes.

The system may also include a feedback loop to control the bias voltage of the semiconductor laser diode and/or the optical amplifier. The system may further include a linear transceiver to output an electrical signal linearly proportional to the optical signal.

The optical amplifier may be configured to operate below the threshold current required for laser action. The optical amplifier may spectrally reshape the optical signal.

Another aspect of the invention is a system including a VCSEL transmitter, and a SOA to receive an optical signal from the VCSEL transmitter. The SOA may be configured to spectrally filter the optical signal.

In one embodiment, the system may include a VCSEL transmitter, and a SOA to receive an optical signal from the VCSEL transmitter. The SOA may be configured to spectrally filter the optical signal, and the SOA is immediately adjacent the VCSEL transmitter without any intervening components except for an optical link to carry the optical signal between the SOA and the VCSEL transmitter. The system may also include a common monolithic integrated circuit to carry the VCSEL transmitter and the SOA.

In another embodiment, the system may include a VCSEL transmitter, and a SOA configured to operate below the threshold current required for laser action to receive an optical signal from the VCSEL transmitter. The SOA may be configured to spectrally filter and reshape the optical signal. The SOA may be immediately adjacent the VCSEL transmitter without any intervening components except for an optical link to carry the optical signal between the SOA and the VCSEL transmitter. The system may also include a common monolithic integrated circuit to carry the VCSEL transmitter and the SOA.

Another aspect of the invention is a method to control optical signals. The method may include receiving an optical signal from the semiconductor laser diode at an optical amplifier. The method may further include spectrally filtering the optical signal with the optical amplifier.

The method may also include positioning the optical amplifier immediately adjacent the semiconductor laser diode without any intervening components except for an optical link to carry the optical signal between the optical amplifier and the semiconductor laser diode. The method may also include offsetting the optical amplifier from the optical signal's centerpoint to enable the optical signal to couple with the optical link's higher order modes.

The method may further include providing a feedback loop to control the bias voltage of at least one of the semiconductor laser diode and the optical amplifier. The method may additionally include spectrally reshaping the optical signal with the optical amplifier.

DETAILED DESCRIPTION OF THE INVENTION

The invention will now be described more fully hereinafter with reference to the accompanying drawings, in which preferred embodiments of the invention are shown. Like numbers refer to like elements throughout, like numbers with letter suffixes are used to identify similar parts in a single embodiment, and prime notations are used to indicate similar elements in alternative embodiments.

Figure 1:
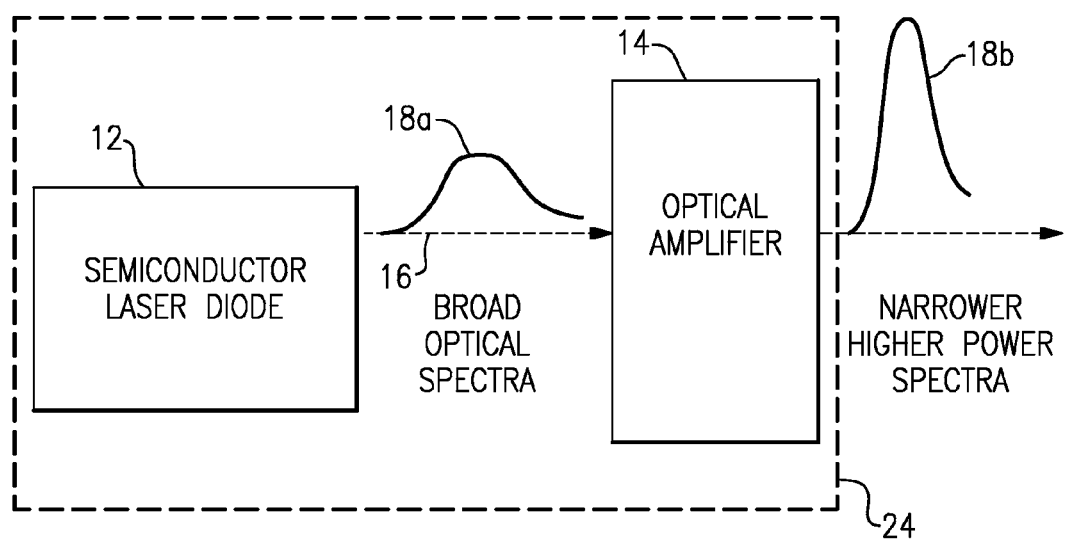
FIG. 1 is a schematic block diagram of a system to control an optical signal in accordance with the invention.

With reference now to FIG. 1, a system 10 to control an optical signal is initially described. In one embodiment, the system 10 may include a semiconductor laser diode 12 and an optical amplifier 14 that receives an optical signal from the semiconductor laser diode. In another embodiment, the optical amplifier 14 is configured to spectrally filter the optical signal 18a.

In one embodiment, the semiconductor laser diode 12 comprises a vertical-cavity surface-emitting laser ("VCSEL") transmitter. In another embodiment, the optical amplifier 14 comprises a semiconductor optical amplifier ("SOA").

In one embodiment, the optical amplifier 14 is adjacent the semiconductor laser diode 12 without any intervening components except for an optical link 16 to carry the optical signal 18a between the optical amplifier and the semiconductor laser diode. In another embodiment, the optical amplifier 14 immediately follows the semiconductor laser diode 12. In other words, the optical amplifier 14 and the semiconductor laser diode 12 touch, very nearly touch, and/or are positioned far closer together than a conventional configuration of such.

In one embodiment, the semiconductor laser diode 12 and the optical amplifier 14 is carried on a common monolithic integrated circuit 24. Stated another way, the semiconductor laser diode 12 and the optical amplifier 14 are on single chip package. In another embodiment, the semiconductor laser diode 12 and the optical amplifier 14 are carried on different chip packages.

Figure 2:
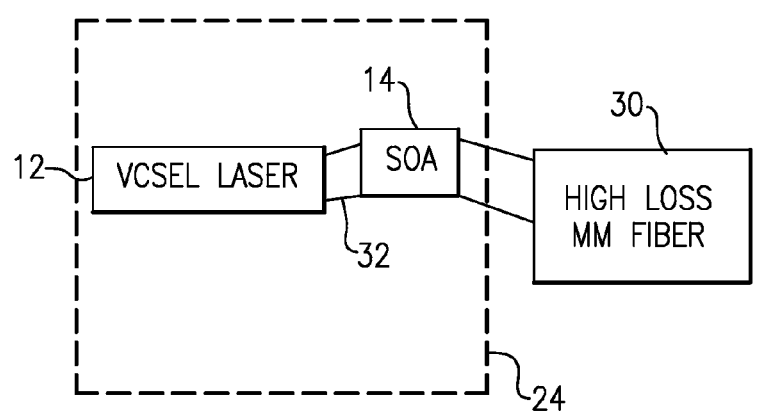
FIG. 2 is a schematic block diagram of another embodiment of the system of FIG. 1 in accordance with the invention.

In another embodiment, the optical amplifier 14 is offset from the optical signal's 18a centerpoint to enable the optical signal to couple with the optical link's 16 higher order modes. In another embodiment, the system 10 provides a selective alignment coupling 32 in which the SOA 14 implementation for SX links shows an offset of 5-9 microns between the alignment of the SOA 14 and optical link's 16 fiber to provide modal compensation with high loss MM fiber 30 as illustrated in FIG. 2

Figure 3:
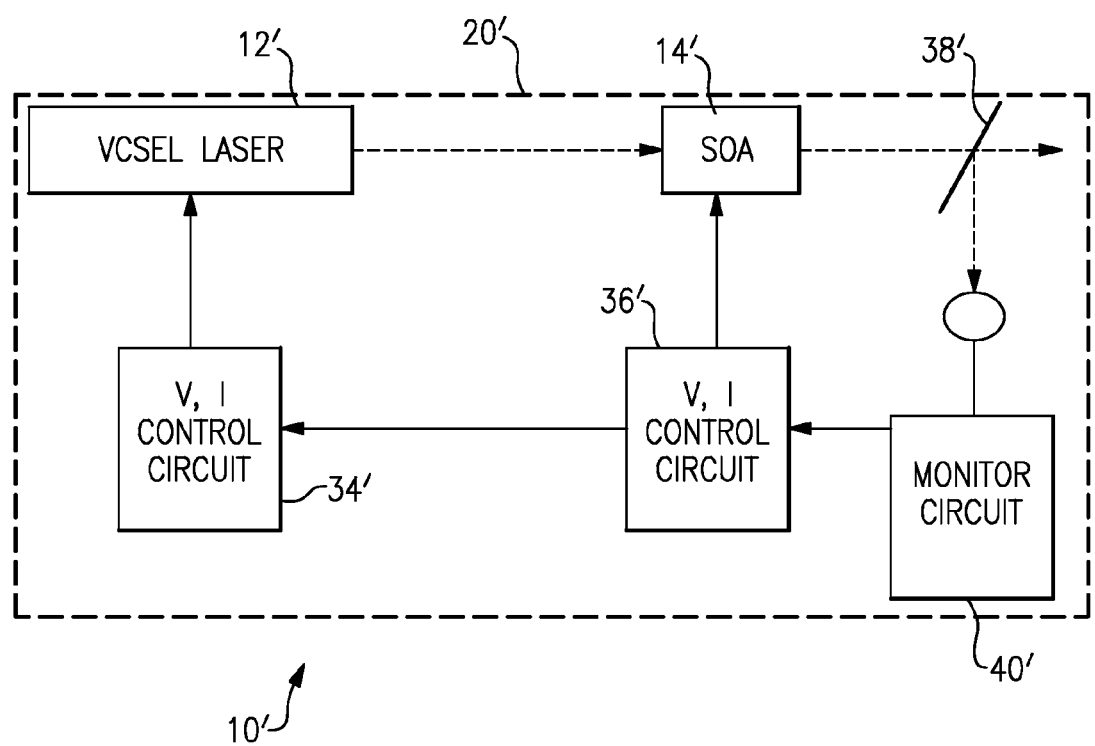
FIG. 3 is a schematic block diagram of another embodiment of the system of FIG. 1 in accordance with the invention.

With additional reference to FIG. 3, in one embodiment, the system 10' also includes a feedback loop 20' to control the bias voltage of the semiconductor laser diode 12' and/or the optical amplifier 14'. In another embodiment, the system 10 further includes a linear transceiver 22 to output an electrical signal linearly proportional to the optical signal 18a as illustrated in FIG. 4.

Figure 4:
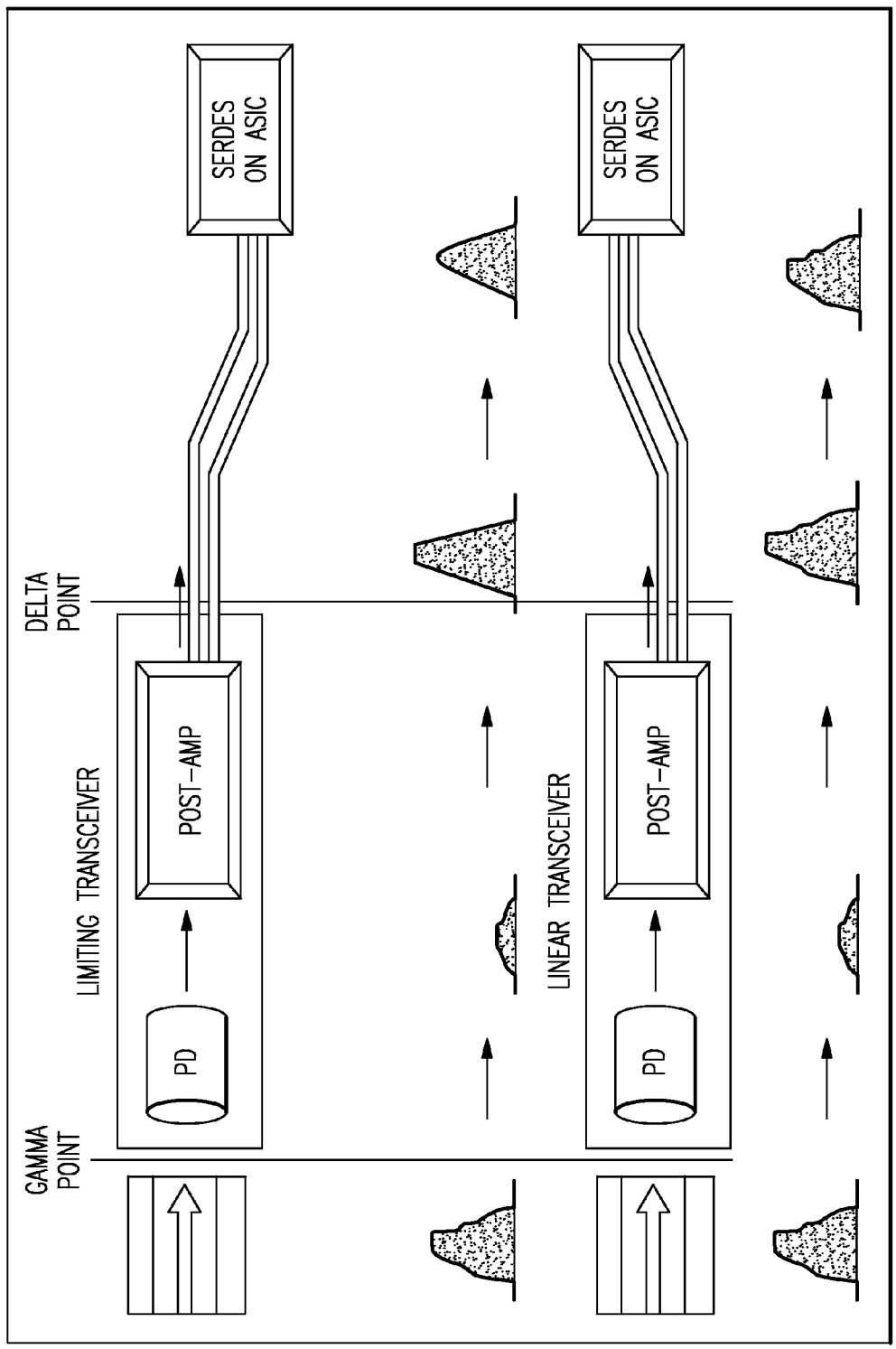
FIG. 4 is a comparison of a limiting transceiver with a linear transceiver in accordance with the invention.
Figure 5:
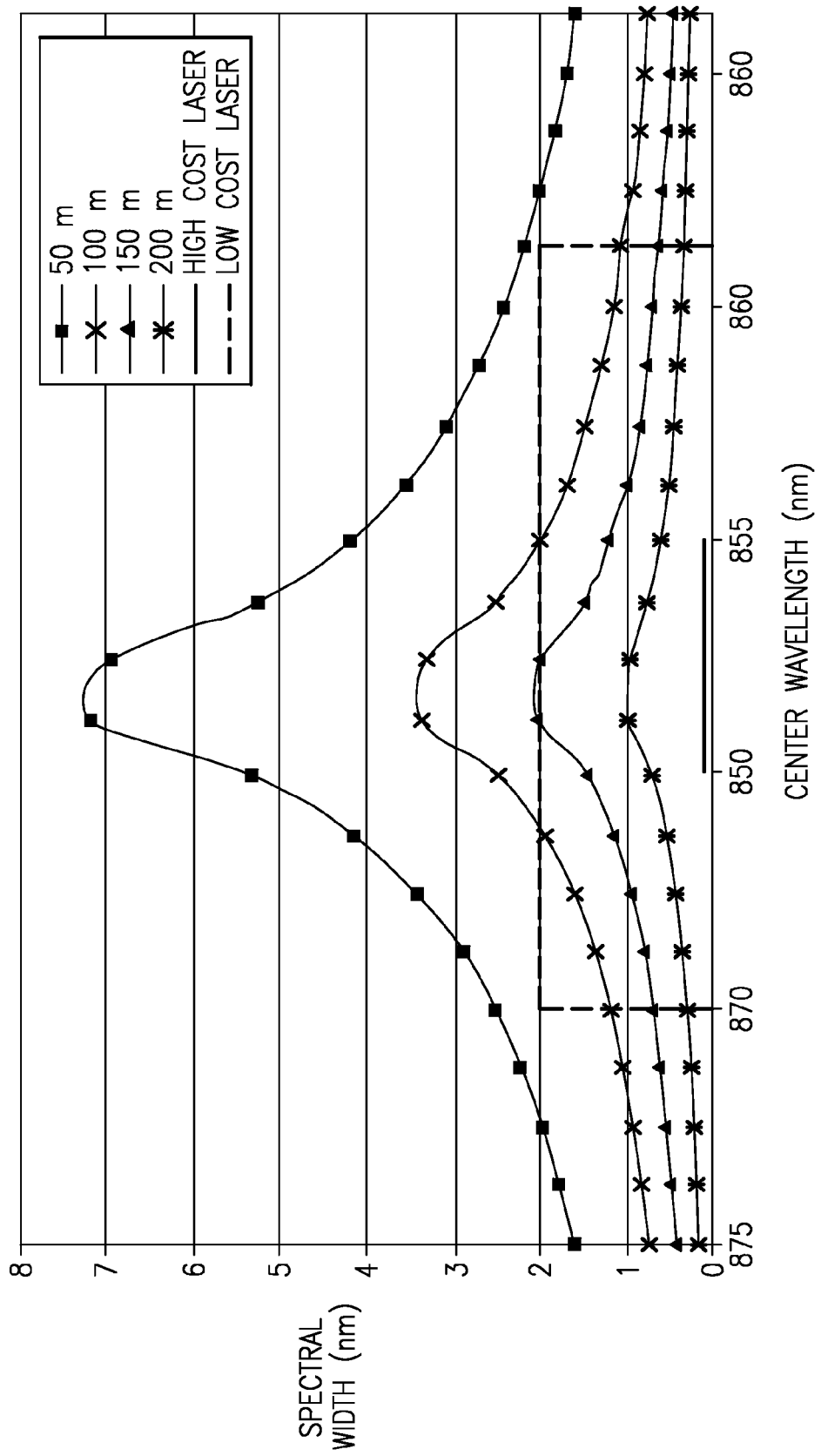
FIG. 5 is a chart illustrating tradeoffs in center wavelength, spectral width, and/or distance for 16 Gbit/s Fibre Channel Protocol links in accordance with the invention.

The differences and similarities of the limiting and linear aspects of a Fibre Channel link are shown in FIG. 4. Both linear and limiting signals are the same until the reach the Post-Amp or receiver 26 and 28. The receiver 26 in the limiting signal retimes the signal by digitizing it with a comparator. The receiver 28 in the linear signal maintains the information in the signal by keeping the output linear so that the application-specific integrated circuit can use the information to extend the length of the link. Signals at each step in the process are shown below the component of the signal path.

In one embodiment, the optical amplifier 14 is configured to operate below the threshold current required for laser action. In another embodiment, the optical amplifier 14 spectrally reshapes the optical signal 18a. For example, the reshaped optical signal 18b can be narrower and have higher power spectra.

In one embodiment, the system 10' includes a VCSEL transmitter 12' and a SOA 14' to receive an optical signal 18a' from the VCSEL transmitter. In another embodiment, the SOA 14' is configured to spectrally filter the optical signal 18a'.

In one embodiment, the system 10' includes a VCSEL transmitter 12' and a SOA 14' to receive an optical signal 18a' from the VCSEL transmitter. In another embodiment, the SOA 14' be configured to spectrally filter the optical signal 18a', and the SOA is immediately adjacent the VCSEL transmitter 12' without any intervening components except for an optical link 16' to carry the optical signal between the SOA and the VCSEL transmitter. In another embodiment, the system 10' also includes a common monolithic integrated circuit 24' to carry the VCSEL transmitter 12' and the SOA 14'.

In one embodiment, the system 10' includes a VCSEL transmitter 12' and a SOA 14', configured to operate below the threshold current required for laser action, to receive an optical signal 18a' from the VCSEL transmitter. In another embodiment, the SOA 14' is configured to spectrally filter and reshape the optical signal 18a'.

In one embodiment, the SOA 14' is immediately adjacent the VCSEL transmitter 12' without any intervening components except for an optical link 16' to carry the optical signal 18a' between the SOA and the VCSEL transmitter. In another embodiment, the system 10' also includes a common monolithic integrated circuit 24' to carry the VCSEL transmitter 12' and the SOA 14'.

In view of the foregoing, the system 10 improves control of an optical signal 18a by dispersion compensating a VCSEL 12 using a SOA 14 in a pre-amplifier configuration to control the laser spectral width. Further, the system 10 extends the bandwidth of SX fiber optic links using VCSEL transmitters combined with semiconductor optical amplifiers in a common package. The system 10 therefore addresses many unsolved problems in optical communications.

For instance, there is a need for custom link budget designs for links which exceed industry standard distances, e.g. to accommodate data center design restrictions such as power and cooling limits that restrict the placement of computer equipment. In addition, there is an industry-wide problem related to the implementation of 16 Gbit/s and higher data rates over multi-mode fiber with SX sources due to excessive dispersion on the fiber optic data links. Since SX links are significantly shorter than LX links, attenuation is not the limiting factor on link design.

Further, the SX laser optical pulses tend to spread out in time as they propagate thorough a fiber in a phenomena known as dispersion. Even in fairly short optical links, dispersion is a limiting factor for bit error rate ("BER") performance and needs to be carefully controlled.

It is not clear that VCSELs currently used in SX links offer sufficiently low dispersion over standard optical fiber when data rates increase. This has led to proposals for deploying new types of optical fiber with enhanced dispersion properties, e.g. OM4 fiber. Unfortunately, this solution is expensive and many will not want to disrupt the operation of their existing networks to install new fiber.

Dispersion is also a function of laser center wavelength and spectral width. While new types of lasers are under development to address this concern, they are not expected to be commercially viable for several years.

It is noted that an SOA functions much like an in-line semiconductor laser diode in that it is optically pumped and it amplifies incoming optical signals without requiring optical/electrical conversions. However, the SOA also affects the optical spectrum of the amplified light, which can induce undesired effects such as dispersion and modal noise.

A SOA differs from a laser diode in that the SOA operates below the threshold current required for laser action. A variant on this design, the traveling wave SOA, can be operated above threshold but has other design and manufacturing problems that have so far prevented its becoming a commercially available device. Because of this, the light emerging from an SOA has a different spectral width than the spectrum of the input light. Thus, an optical signal entering the SOA will both be amplified and experience changes in its spectral properties in that the additional optical power is distributed across a different range of frequencies.

In applications which require extremely long distances, the most desirable feature of the SOA is high gain, and typical commercial SOAs are designed with a broad spectral width to accommodate a wider range of input devices as well as possible wavelength multiplexing in some cases. If the SOA is operated at higher voltages or currents, still below threshold, the gain increases and the spectral broadening changes as well. To optimize the achievable distance, SOAs are usually positioned near the middle of a long distance optical link.

The system 10 uses the SOA 14 in a manner very different from its conventional applications. In system 10, the SOA 14 is in a pre-amplifier configuration where it is located immediately after the VCSEL 12 laser transmitter and where the laser output power is already at its highest. The SOA 14 acts as a filter to discard spectral components which are not required of the optical signal 18a thereby effectively narrowing and reshaping the spectra of a VCSEL 12 laser.

The remaining spectral components experience gain and thus the total optical power output is preserved. In fact, the SOA 14 gain can overcome any optical coupling or insertion loss associated with the SOA. This is an important advantage, since multimode optical fibers at short wavelengths typically have much higher loss, e.g. around 3-5 dB per km, as compared with single-mode fibers, e.g. 0.5 dB/km. Thus, system 10 compensates for multimode fiber dispersion and potentially increases coupled optical power into the fiber. As an alternate embodiment, the bias voltage of the SOA 14, VCSEL 12, or both can be dynamically adjusted using a feedback loop 20' based on an optical splitter 38' which samples the output light as illustrated in FIG. 3.

Furthermore, the SOA 14 provides another important function in SX transceivers, namely compensation for differential mode delay ("DMD"). It is known that when optical power from an SX source is launched into a multimode fiber, care must be taken to insure that all propagating modes within the fiber are excited equally. Failure to do this, for example by launching most of the optical power into modes near the fiber core, leads to DMD and modal noise.

One approach to correcting this problem involves using a controlled offset launch of light into the fiber. Such may be accomplished in the conventional art by using a fiber connector/ferrule in which the fiber is displaced by 5 to 9 microns from the center of the laser spot. This preferentially launches power into higher order modes, so that the mode power distribution within the fiber is equalized.

However, this approach requires non-standard optical connectors with precise tolerances and is expensive. In addition, it means that one must keep track of a different type of multimode connector assembly just for SX laser links.

In contrast, the system 10 uses a controlled offset in alignment between the SOA 14 and the fiber within an optical transceiver. Only the fraction of laser light which passes through the SOA 14 will be spectrally reshaped and coupled into the fiber. As a result, the SOA 14 also acts as a spatial filter, and only light which passes through the SOA will propagate through the fiber. In other words, by offsetting the SOA 14 a controlled amount from the laser centerpoint, e.g. the optical signal's 18a centerpoint, the system 10 can use the SOA to preferentially couple into the fiber's higher order modes and achieve the desired uniform power profile without the need for a special optical connector. In another embodiment, system 10 deliberately offsets the alignment between the VCSEL 12 and SOA 14 for multimode applications, so as to control the modal launch profile and preferentially excite only certain modes of the optical fiber. It is noted that the misalignment will lower the achievable peak optical power.

Another aspect of this invention involves a proposed redesign of the optical receiver to use a modified linear receiver 28, rather than a conventional limiting receiver design 26. As illustrated in FIG. 4, instead of using a simple comparator as in a conventional receiver 26 the output of the linear receiver 28 remains linear or proportional to the optical signal. By contrast, the limiting receiver 26 output is either high or low and "limited" by the voltage output of the comparator.

A noticeable difference between linear receiver 28 and limiting receiver 26 designs occur when signals reach their respective receiver post-amp 30 and 32. The receiver 26 in the limiting signal retimes the signal by digitizing it with a comparator. The receiver 28 in the linear signal maintains the information in the signal by keeping the output linear, and this would normally be done to enable signal processing that extends the link distance, e.g. such as electronic dispersion compensation, but in this case, system 10 uses the linear design to provide the strongest possible optical signal over a relatively short distance.

One can see this by considering the electrical signal output at the delta points, which define the properties of the electrical connection between the optical receiver and associated circuitry. In a limiting receiver 26, the delta point is sampled to one of several discrete levels, while in the linear design 28 the output is proportional to the input signal. On a fairly short link where the dominant noise sources are electronic interference, the linear receiver is preferred since it provides an additional link budget increase and relaxes requirements on the optical detector.

In one embodiment, the SOA 14 is not being used for its amplification properties, but rather it is used as a frequency-selective component to spectrally filter the laser output of VCSEL 12. In another embodiment, the SOA 14 is not used for gain clamping, and in fact the amount of gain produced by the SOA is not critical as it would be in other conventional applications.

In one embodiment, the SOA 14 only needs to selectively amplify those components of the laser spectra that are desired to adjust the overall frequency envelope and minimize dispersion as described earlier. Stated another way, the SOA 14 selectively shapes the spectral frequency content of the laser so that the resulting optical signal 18a will experience less dispersion when traveling through an optical fiber communication link. As a result, system 10 addresses the optical signal's 18a spectral properties in the frequency domain.

In one embodiment, another novel feature is the laser feedback loop 20' apparatus, which provides the means for real time control of the spectral content. The feedback control loop 20' to monitors the SOA 14 bias voltage, with a monitor 40' and control circuits 36 and 38 that allows the SOA to regulate the laser bias voltage and/or current as a means of controlling its spectral output, e.g. its spectral width, center wavelength, and/or both. In another embodiment, the system 10 samples the output light after it passes through the SOA 14, and uses the spectral content and/or signal strength to control both the SOA bias voltage and VCSEL 12 laser bias voltage. In another embodiment, the redesign of the optical receiver to better compensate for spectral dispersion represents another novel component of this design.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system comprising:
   a semiconductor laser diode;
   an optical amplifier to receive an optical signal from the semiconductor laser diode, and the optical amplifier is configured to spectrally filter the optical signal; and
   a linear transceiver to output an electrical signal linearly proportional to the optical signal.

2. The system of claim 1 wherein the semiconductor laser diode comprises a vertical-cavity surface-emitting laser transmitter.

3. The system of claim 1 wherein the optical amplifier comprises a semiconductor optical amplifier.

4. The system of claim 1 wherein the optical amplifier is adjacent the semiconductor laser diode without any intervening components except for an optical link to carry the optical signal between the optical amplifier and the semiconductor laser diode.

5. The system of claim 4 wherein the optical amplifier immediately follows the semiconductor laser diode.

6. The system of claim 1 wherein the semiconductor laser diode and the optical amplifier are carried on a common monolithic integrated circuit.

7. The system of claim 4 wherein the optical amplifier is offset from the optical signal's centerpoint to enable the optical signal to couple with the optical link's higher order modes.

8. The system of claim 1 further comprising a feedback loop to control the bias voltage of at least one of the semiconductor laser diode and the optical amplifier.

9. The system of claim 1 wherein the optical amplifier is configured to operate below the threshold current required for laser action.

10. The system of claim 1 wherein the optical amplifier spectrally reshapes the optical signal.

11. A system comprising:
    a vertical-cavity surface-emitting laser transmitter;
    a semiconductor optical amplifier to receive an optical signal from the vertical-cavity surface-emitting laser transmitter, and the semiconductor optical amplifier is configured to spectrally filter the optical signal; and
    a linear transceiver to output an electrical signal linearly proportional to the optical signal.

12. The system of claim 11 wherein the semiconductor optical amplifier is immediately adjacent the vertical-cavity surface-emitting laser transmitter without any intervening components except for an optical link to carry the optical signal between the semiconductor optical amplifier and the vertical-cavity surface-emitting laser transmitter.

13. The system of claim 11 wherein the vertical-cavity surface-emitting laser transmitter and the semiconductor optical amplifier are carried on a common monolithic integrated circuit, and the semiconductor optical amplifier is offset from the optical signal's centerpoint to enable the optical signal to couple with the optical link's higher order modes.

14. The system of claim 11 further comprising:
    a feedback loop to control the bias voltage of at least one of the vertical-cavity surface-emitting laser transmitter and the semiconductor optical amplifier; and
    wherein the semiconductor optical amplifier spectrally reshapes the optical signal.

15. A method comprising:
    receiving an optical signal from the semiconductor laser diode at an optical amplifier;
    spectrally filtering the optical signal with the optical amplifier; and
    outputting an electrical signal linearly proportional to the optical signal with a linear transceiver.

16. The method of claim 15 further comprising positioning the optical amplifier immediately adjacent the semiconductor laser diode without any intervening components except for an optical link to carry the optical signal between the optical amplifier and the semiconductor laser diode.

17. The method of claim 15 further comprising offsetting the optical amplifier from the optical signal's centerpoint to enable the optical signal to couple with the optical link's higher order modes.

18. The method of claim 15 further comprising providing a feedback loop to control the bias voltage of at least one of the semiconductor laser diode and the optical amplifier.

19. The method of claim 15 further comprising spectrally reshaping the optical signal with the optical amplifier.

* * * * *